United States Patent
Bao et al.

(10) Patent No.: US 12,048,210 B2
(45) Date of Patent: Jul. 23, 2024

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Zheng Bao, Beijing (CN); Gong Chen, Beijing (CN); Kangguan Pan, Beijing (CN); Yanxia Xin, Beijing (CN); Hongwei Hu, Beijing (CN); Xueping Li, Beijing (CN); Yihao Wu, Beijing (CN); Xiaoyun Wang, Beijing (CN); Yong Zhuo, Beijing (CN); Zhongqian Guo, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 555 days.

(21) Appl. No.: 17/425,733

(22) PCT Filed: Jan. 25, 2021

(86) PCT No.: PCT/CN2021/073619
§ 371 (c)(1),
(2) Date: Jul. 26, 2021

(87) PCT Pub. No.: WO2021/164501
PCT Pub. Date: Aug. 21, 2021

(65) Prior Publication Data
US 2022/0320240 A1 Oct. 6, 2022

(30) Foreign Application Priority Data
Feb. 19, 2020 (CN) .......................... 202010102967.6

(51) Int. Cl.
*H01L 27/32* (2006.01)
*H10K 59/121* (2023.01)
(Continued)

(52) U.S. Cl.
CPC ....... *H10K 59/131* (2023.02); *H10K 59/1213* (2023.02); *H10K 59/122* (2023.02)

(58) Field of Classification Search
CPC .. H10K 50/826; H10K 50/841; H10K 50/844; H10K 59/1213; H10K 59/122; H10K 59/131
See application file for complete search history.

(56) References Cited

U.S. PATENT DOCUMENTS

2018/0233541 A1* 8/2018 Zeng ..................... G06F 3/0445
2020/0287163 A1* 9/2020 Lv ......................... H10K 50/844
(Continued)

FOREIGN PATENT DOCUMENTS

| CN | 106873839 A | 6/2017 |
| CN | 107845667 A | 3/2018 |

(Continued)

OTHER PUBLICATIONS

International Search Report for PCT/CN2021/073619 Mailed May 6, 2021.

*Primary Examiner* — David C Spalla
(74) *Attorney, Agent, or Firm* — Ling Wu; Stephen Yang; Ling and Yang Intellectual Property

(57) ABSTRACT

A display panel includes a substrate, a plurality of data lines, at least one circle of barrier wall structure, and a connector. The substrate includes a display area, and a peripheral area which surrounds the display area and includes a fan-out area. The plurality of data lines are located on one side of the substrate and in the display area, extending from the display area to the fan-out area. The at least one circle of barrier wall
(Continued)

structure surrounds the display area, and at least a part of the at least one circle of barrier wall structure is located in the fan-out area. The connector is located between the plurality of data lines and the barrier wall structure, and one end, away from the substrate, of the connector extends into the barrier wall structure to fasten the barrier wall structure.

20 Claims, 4 Drawing Sheets

(51) Int. Cl.
*H10K 59/122* (2023.01)
*H10K 59/131* (2023.01)

(56) References Cited

U.S. PATENT DOCUMENTS

| | | | |
|---|---|---|---|
| 2021/0066651 A1* | 3/2021 | Kishimoto | H10K 59/121 |
| 2021/0091339 A1* | 3/2021 | Kishimoto | H10K 59/1201 |
| 2022/0130929 A1* | 4/2022 | Saida | H10K 59/124 |
| 2023/0077957 A1* | 3/2023 | Okabe | H10K 59/124 257/40 |

FOREIGN PATENT DOCUMENTS

| | | |
|---|---|---|
| CN | 109920937 A | 6/2019 |
| CN | 111192911 A | 5/2020 |
| WO | 2019127203 A1 | 7/2019 |

* cited by examiner

DISPLAY PANEL AND DISPLAY DEVICE

CROSS-REFERENCE TO RELATED APPLICATIONS

The present application is a U.S. National Phase Entry of International Application No. PCT/CN2021/073619 having an international filing date of Jan. 25, 2021, which claims priority to Chinese patent application No. 202010102967.6, filed to CNIPA on Feb. 19, 2020 and entitled "Display Panel and Display Device". The entire contents of the above-identified applications are hereby incorporated by reference.

TECHNICAL FIELD

Embodiments of the disclosure relate, but are not limited, to the technical field of display, and more particularly to a display panel and a display device.

BACKGROUND

An Organic Light Emitting Diode (OLED) is an active light emitting display having the advantages such as self-illumination, wide viewing angle, high contrast, low power consumption, and high response speed. OLED displays are widely accepted by customers due to their advantages such as bright color, low power consumption, thinned type, and flexibility. With the continuous development of display technologies, the OLED technology is increasingly applied to various display devices, especially smart terminal products such as cellphones and tablet personnel computers.

SUMMARY

The following is an overview of the subject matter described in detail in the disclosure. The overview is not intended to limit the protection scope of the claims.

An objective of the embodiments of the disclosure is to provide a display panel and a display device.

The embodiments of the disclosure provide a display panel, including a substrate, a plurality of sub-pixels, a plurality of data lines, at least one circle of barrier wall structure, and a connector.

The substrate includes a display area and a peripheral area which surrounds the display area and includes a fan-out area.

The plurality of sub-pixels are located in the display area.

The plurality of data lines are located on one side of the substrate and in the display area, extend from the display area to the fan-out area, and are arranged to provide data signals to the plurality of sub-pixels.

The at least one circle of barrier wall structure surrounds the display area. At least a part of the at least one circle of barrier wall structure is located in the fan-out area. The at least one circle of barrier wall structure is located on one side, away from the substrate, of the plurality of data lines.

The connector is located between the plurality of data lines and the at least one circle of barrier wall structure. One end, away from the substrate, of the connector, extends into the at least one circle of barrier wall structure to fasten the at least one circle of barrier wall structure.

In an exemplary embodiment, the display panel further includes an insulating layer located between the plurality of data lines and the at least one circle of barrier wall structure. The connector is located between the insulating layer and the at least one circle of barrier wall structure, and one end, facing the substrate, of the connector is embedded in the insulating layer.

In an exemplary embodiment, the insulating layer is provided with via holes. The connector is in contact connection with the data lines through the via holes.

In an exemplary embodiment, the plurality of data lines include a plurality of first data lines and a plurality of second data lines. The insulating layer includes a first insulating layer, and the first insulating layer is located on one side, away from the substrate, of the plurality of first data lines. The plurality of second data lines are located on one side, away from the substrate, of the first insulating layer.

The connector includes a first connector and a second connector. The via holes include first via holes formed on the first insulating layer. The first connector is in contact connection with the first data line through the first via hole. The second connector is in contact connection with the second data line.

In an exemplary embodiment, the insulating layer further includes a second insulating layer. The second insulating layer is located on one side, away from the substrate, of the plurality of second data lines. The first via holes penetrate the first insulating layer and the second insulating layer. The via holes further include second via holes formed on the second insulating layer. The second connector is in contact connection with the second data line through the second via hole.

In an exemplary embodiment, a material of the connector includes metal, and the display panel further includes an inorganic encapsulating layer arranged on one side, away from the substrate, of the at least one circle of barrier wall structure.

In an exemplary embodiment, the sub-pixels include thin-film transistors, and the connector and source electrodes or drain electrodes of the thin-film transistors are arranged in the same layer.

In an exemplary embodiment, the at least one circle of barrier wall structure includes a first circle of barrier wall, the first circle of barrier wall includes a first sub-barrier wall and a second sub-barrier wall which are sequentially stacked, the first sub-barrier wall faces the substrate, and one end, away from the substrate, of the connector extends into the first sub-barrier wall.

In an exemplary embodiment, the at least one circle of barrier wall structure further includes a second circle of barrier wall, the second circle of barrier wall is located on one side, away from the display area, of the first circle of barrier wall, and includes a third sub-barrier wall, a fourth sub-barrier wall, and a fifth sub-barrier wall which are sequentially superposed, the third sub-barrier wall faces the substrate, and one end, away from the substrate, of the connector extends into the third sub-barrier wall.

In an exemplary embodiment, the display panel further includes a flat layer located in the display area; the flat layer is located on one side, away from the substrate, of the connector, and the third sub-barrier wall and the flat layer are arranged in the same layer.

In an exemplary embodiment, the display panel further includes a pixel definition layer located in the display area; the pixel definition layer is located on one side, away from the substrate, of the flat layer, and both the first sub-barrier wall and the fourth sub-barrier wall are arranged in the same layer as the pixel definition layer.

In an exemplary embodiment, the second sub-barrier wall and the fifth sub-barrier wall are arranged in the same layer.

The embodiments of the disclosure further provide a display device, including the display panel as described above.

Other features and advantages of the disclosure will be described in the following description, and will be partially apparent from the description, or understood by implementing the disclosure.

After reading and understanding the accompany drawings and detailed description, other aspects can be understood.

BRIEF DESCRIPTION OF DRAWINGS

The accompany drawings are used to provide further understanding of the technical solution of the disclosure, and form a part of the description. The accompany drawings and embodiments of the disclosure are adopted to explain the technical solution of the disclosure, and do not form limits to the technical solution of the disclosure.

DETAILED DESCRIPTION

The embodiments of the disclosure will be described in detail below in combination with the accompany drawings. The embodiments and features in the embodiments of the disclosure may be randomly combined with each other in case of no conflicts.

An OLED display panel includes a display area and a peripheral area which surrounds the display area and includes a fan-out area. In the OLED display panel, a barrier wall structure that surrounds the display area is generally arranged in the peripheral area, and at least a part of the barrier wall structure is located in the fan-out area. In the case that the part of the barrier wall structure located in the fan-out area is missing, a risk of the defective display panel is caused.

Figure 1:
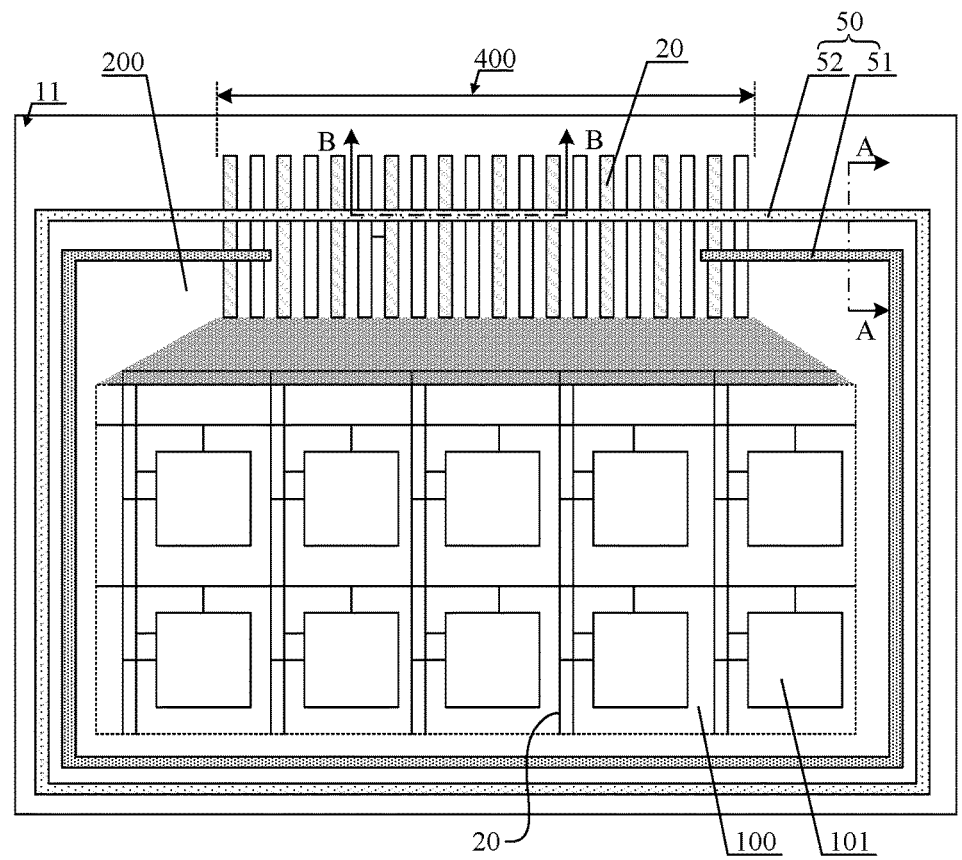
FIG. 1 is a top-view schematic structural diagram of an OLED display panel.
Figure 2:
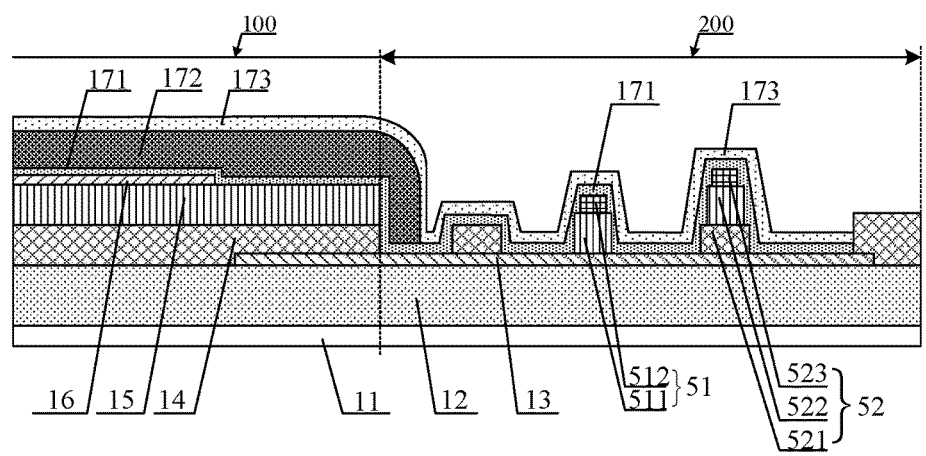
FIG. 2 is a schematic structural diagram of a section A-A in FIG. 1.
Figure 3:
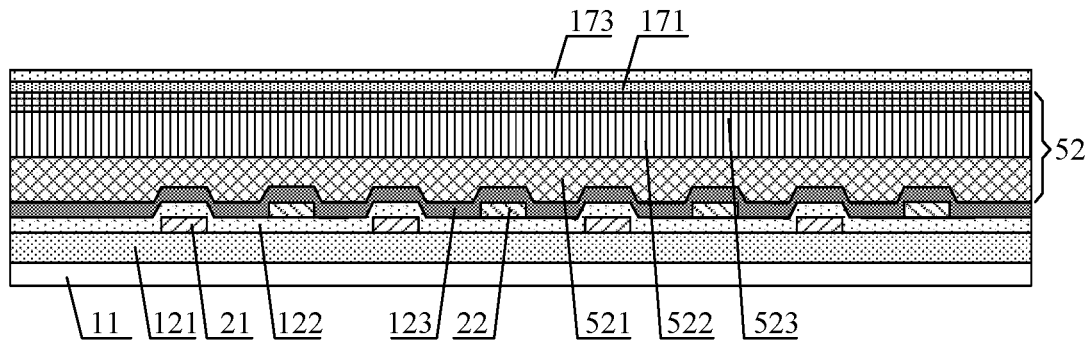
FIG. 3 is a schematic structural diagram of a section B-B in FIG. 1.

FIG. 1 is a top-view schematic structural diagram of an OLED display panel, FIG. 2 is a schematic structural diagram of a section A-A in FIG. 1, and FIG. 3 is a schematic structural diagram of a section B-B in FIG. 1. As shown in FIG. 1, FIG. 2, and FIG. 3, the display panel includes a substrate 11. The substrate 11 includes a display area 100 and a peripheral area 200 which surrounds the display area 100 and includes a fan-out area 400. The display panel further includes a plurality of sub-pixels 101 and a plurality of data lines 20. The plurality of sub-pixels 101 are located in the display area 100. The plurality of data lines 20 are located on one side of the substrate 11 and in the display area 100. The plurality of data lines 20 extend from the display area 100 to the fan-out area 400, and are arranged to provide data signals to the plurality of sub-pixels 101. The display panel further includes at least one circle of barrier wall structure 50 which surrounds the display area 100. At least a part of the at least one circle of barrier wall structure 50 is located in the fan-out area 400. The at least one circle of barrier wall structure 50 is located on one side, away from the substrate 11, of the plurality of data lines 20.

As shown in FIG. 2, the display panel includes the substrate 11. An insulating structural layer 12 is arranged on the substrate 11. A power supply layer (VDD) 13 is arranged on the insulating structural layer 12. A flat layer 14 located in the display area 100 is arranged on the power supply layer 13. A pixel definition layer 15 is arranged on the flat layer 14. An electrode layer 16 (a cathode layer of an OLED) is arranged on the pixel definition layer 15. A first inorganic encapsulating layer 171, an organic encapsulating layer 172, and a second inorganic encapsulating layer 173 are sequentially arranged on the electrode layer 16. The at least one circle of barrier wall structure 50 is located on the power supply layer 13 and in the peripheral area 200. The barrier wall structure 500 includes a first circle of barrier wall 51 and a second circle of barrier wall 52 which are arranged at an interval. The second circle of barrier wall 52 is located on one side, far away from the display area 100, of the first circle of barrier wall 51. The barrier wall structure 50 is covered with the first inorganic encapsulating layer 171 and the second inorganic encapsulating layer 173. During processing of the display panel, in forming of the organic encapsulating layer 172 by an ink-jet printing process, the barrier wall structure 50 may prevent the organic encapsulating layer 172 from spilling. In forming of the barrier wall structure 50, a flat thin-film for forming the flat layer 14 is subjected to a grooving process, so that, as shown in FIG. 2, the flat layer 14 may include a part located in the display area 100, and a part located in the peripheral area 200 and close to the edge of the display panel, and the barrier wall structure 50 is located between the two parts of the flat layer. In forming of the barrier wall structure 50, the flat thin-film for forming the flat layer 14 is subjected to the grooving process, the part, located in the peripheral area 200 and close to the edge of the display panel, of the flat layer 14 is disconnected from the part, located in the display area 100, of the flat layer 14, and thus external water and oxygen can be prevented from intruding the display area 100 through the flat layer 14, thereby achieving a better encapsulating effect.

In the display panel, both widths of the first circle of barrier wall 51 and the second circle of barrier wall 52 are narrow, which are about 50 μm. Those skilled in the art understand that the width of the barrier wall is a size of the barrier wall in a direction perpendicular to an extension direction of the barrier wall. In FIG. 2, the width of the first circle of barrier wall 51 is a size of the first circle of barrier wall 51 in a width direction of a principal plane. The width of the second circle of barrier wall 52 is a size of the second circle of barrier wall 52 in a width direction of the principal plane.

As shown in FIG. 1 and FIG. 3, in the fan-out area 400, the plurality of data lines 20 are arranged side by side and spaced part. Along the section B-B of the second circle of barrier wall 52, as shown in FIG. 3, the display panel may include a substrate 11. A third insulating layer 121 is arranged on the substrate 11. A plurality of first data lines 21 are arranged on the third insulating layer 121 at intervals. A first insulating layer 122 is arranged on the first data lines 21. A plurality of second data lines 22 are arranged on the first insulating layer 122 at intervals. The metal wiring 20 includes the first data lines 21 and the second data lines 22, and the second data lines 22 and the first data lines 21 are staggered at intervals, as shown in FIG. 1 and FIG. 3. A second insulating layer 123 is arranged on the second data lines 22. The second circle of barrier wall 52 is arranged on the second insulating layer 123, and the first inorganic encapsulating layer 171 and the second inorganic encapsulating layer 173 are sequentially arranged on the second circle of barrier wall 52.

Those skilled in the art understand that the first insulating layer 122 and the second insulating layer 123 are generally formed by a deposition method, and therefore an upper surface of the second insulating layer 123 may maintain the morphology of a lower structure. Since the first data lines 21 and the second data lines 22 are staggered at intervals, the upper surface of the second insulating layer 123, at positions of the first data lines 21 and the second data lines 22, are raised, while the upper surface of the second insulating layer 123, at other positions, are recessed. Thus, the upper surface of the second insulating layer 123 is uneven, as shown in FIG. 3. In addition, the width of the second circle of barrier wall 52 is only about 50 μm, so that an adhesion force between the second circle of barrier wall 52 and the upper surface of the second insulating layer 123 is small. Similarly, an adhesion force between the first circle of barrier wall 51 and the upper surface of the second insulating layer 123 is also small. During processing of the display panel, there are many cleaning (e.g., spraying, and air knives) processes. Due to the small adhesion force between a bottom of the barrier wall structure and the upper surface of the second insulating layer 123, a missing barrier wall may be caused by the cleaning processes. For example, in FIG. 1, the first circle of barrier wall 51 in the fan-out area 400 is missing due to the cleaning processes, which may cause a risk of the defective display panel.

The embodiments of the disclosure provide a display panel. The display panel may include a substrate, a plurality of sub-pixels, a plurality of data lines, at least one circle of barrier wall structure, and a connector.

The substrate includes a display area and a peripheral area which surrounds the display area and includes a fan-out area.

The plurality of sub-pixels are located in the display area.

The plurality of data lines are located on one side of the substrate and in the display area, extend from the display area to the fan-out area, and are arranged to provide data signals to the plurality of sub-pixels.

The at least one circle of barrier wall structure surrounds the display area. At least a part of the at least one circle of barrier wall structure is located in the fan-out area. The at least one circle of barrier wall structure is located on one side, away from the substrate, of the plurality of data lines.

The connector is located between the plurality of data lines and the at least one circle of barrier wall structure. One end, away from the substrate, of the connector extends into the at least one circle of barrier wall structure to fasten the at least one circle of barrier wall structure.

The technical content of the disclosure will be described in detail below through embodiments.

Figure 4:
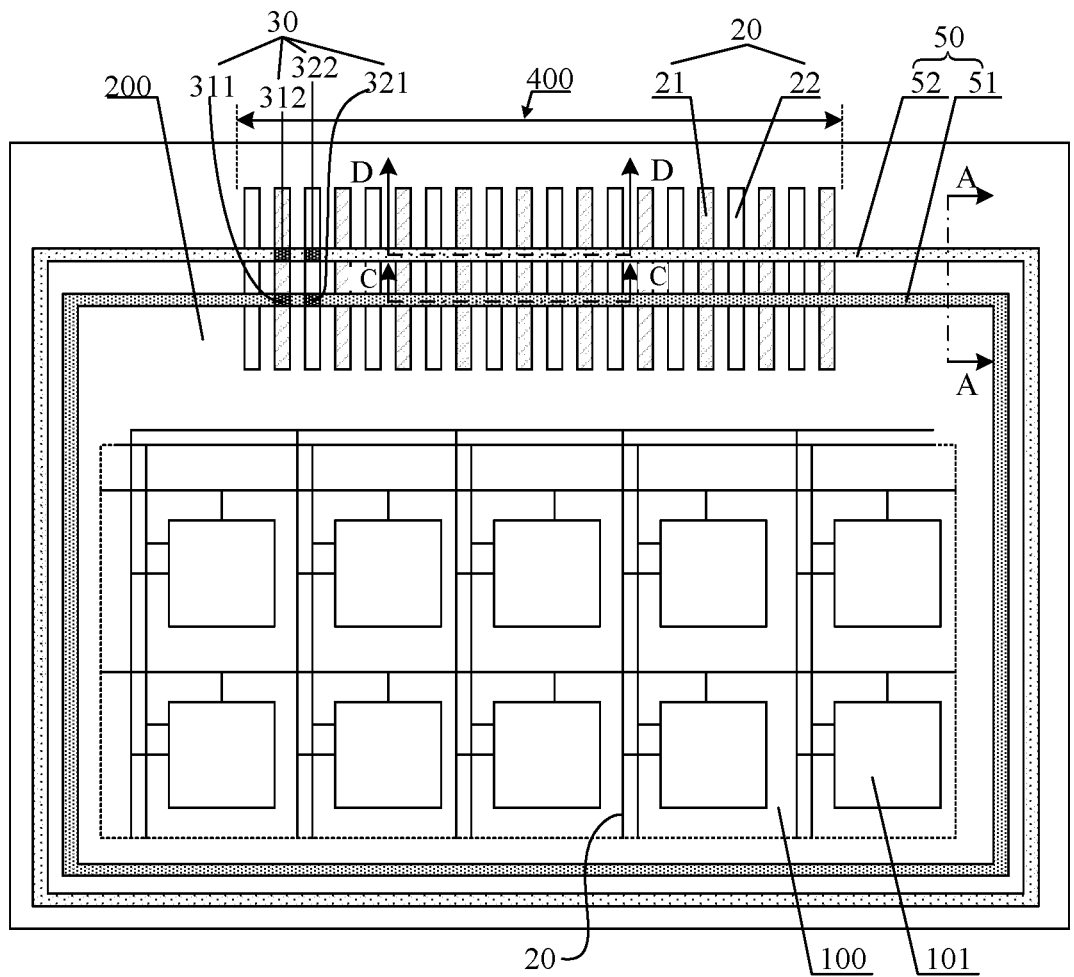
FIG. 4 is a top-view schematic structural diagram of a display panel according to an embodiment of the disclosure.
Figure 5:
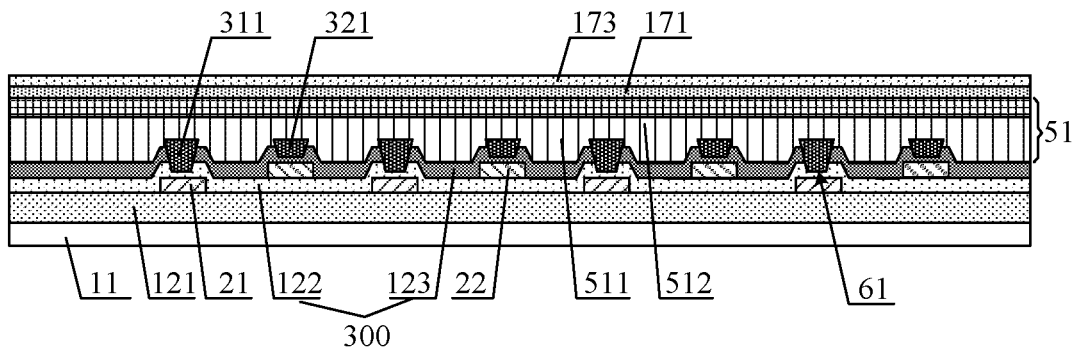
FIG. 5 is a schematic structural diagram of a section C-C in FIG. 4 according to an exemplary embodiment.
Figure 6:
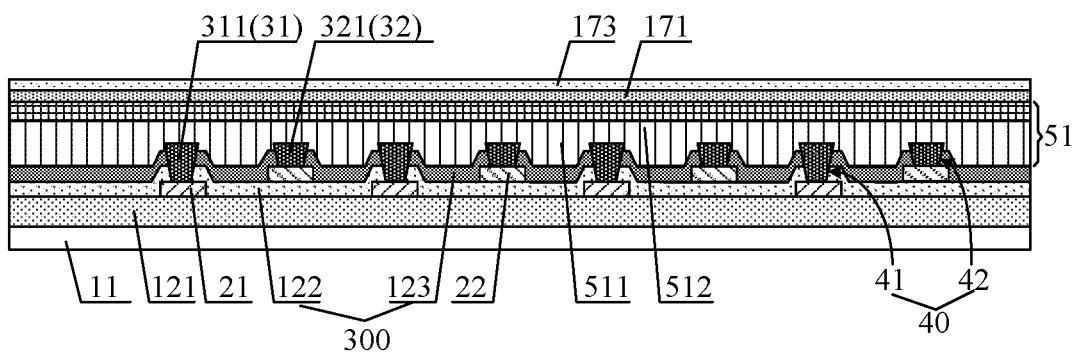
FIG. 6 is a schematic structural diagram of the section C-C in FIG. 4 according to another exemplary embodiment.

FIG. 4 is a top-view schematic structural diagram of a display panel according to an embodiment of the disclosure; FIG. 5 is a schematic structural diagram of a section C-C in FIG. 4 according to an exemplary embodiment; and FIG. 6 is a schematic structural diagram of the section C-C in FIG. 4 according to another exemplary embodiment. As shown in FIG. 4 and FIG. 5, the display panel may include a substrate 11. The substrate 11 may include a display area 100 and a peripheral area 200 which surrounds the display area 100 and includes a fan-out area 400. The display panel may further include a plurality of sub-pixels 101 and a plurality of data lines 20. The plurality of sub-pixels 101 are located in the display area 100. The plurality of data lines 20 are located on one side of the substrate 11 and in the display area 100. The plurality of data lines 20 extend from the display area 100 to the fan-out area 400, and are arranged to provide data signals to the plurality of sub-pixels 101.

As shown in FIG. 4 and FIG. 5, the display panel may further include at least one circle of barrier wall structure 50 which is located in the peripheral area 200. At least a part of the at least one circle of barrier wall structure 50 is located in the fan-out area 400. The at least one circle of barrier wall structure 50 is located on one side, away from the substrate 11, of the plurality of data lines 20.

As shown in FIG. 5, the display panel further includes connector 30. The connector 30 is located between the plurality of data lines 20 and the at least one circle of barrier wall structure 50. One end, away from the substrate 11, of the connector 30 extends into the at least one circle of barrier wall structure 50 to fasten the at least one circle of barrier wall structure 50.

In the display panel according to the embodiment of disclosure, as shown in FIG. 5, the end, away from the substrate 11, of the connector 30 extends into the at least one circle of barrier wall structure 50 to fasten the at least one circle of barrier wall structure 50. Thus, the connector 30 is like a fastening rod, which plays a role as a rivet to fasten the at least one circle of barrier wall structure 50 to the display panel by riveting, thereby improving stability of the at least one circle of barrier wall structure 50, lowering the risk of breakage and deficiency of the at least one circle of barrier wall structure 50, and avoiding the risk of the defective display panel.

In an exemplary embodiment, as shown in FIG. 4, the plurality of data lines 20 are sequentially arranged in the fan-out area 400 at intervals.

In an exemplary embodiment, as shown in FIG. 5, the display panel may further include an insulating layer 300 located between the plurality of data lines 20 and the at least one circle of barrier wall structure 50. Connector 30 is located between the insulating layer 300 and the at least one circle of barrier wall structure 50, and one end, facing the substrate 11, of the connector 30 is embedded into the insulating layer 300. Thus, the end, away from the substrate 11, of the connector 30 extends into the at least one circle of barrier wall structure 50, the end, facing the substrate 11, of the connector 30 is embedded into the insulating layer 300; the connector 30 is like a fastening rod which can play a role as a rivet to fasten the at least one circle of barrier wall structure 50 to the display panel by riveting, thereby improving stability of the at least one circle of barrier wall structure 50, lowering the risk of breakage and deficiency of the at least one circle of barrier wall structure 50, and avoiding the risk of the defective display panel.

In an exemplary embodiment, as shown in FIG. 4 and FIG. 5, the insulating layer 300 may be provided with grooves 61. The end, facing the substrate 11, of the connector 30 is embedded into the corresponding groove 61 of the insulating layer 300 to fasten the end, facing the substrate 11, of the connector 30.

In an exemplary embodiment, as shown in FIG. 4 and FIG. 6, the insulating layer 300 is provided with via holes 40, and the connector 30 is in contact connection with the data lines 20 through the via holes 40. That is to say, the connector 30 penetrates the insulating layer 300 and is in contact connection with the upper surfaces of the data lines 20. Such a structure may improve fastening performance of a lower end of the connector 30, so that the connector 30 can fasten the at least one circle of barrier wall structure 50 better.

In an exemplary embodiment, as shown in FIG. 4 and FIG. 6, the plurality of data lines 20 may include a plurality of first data lines 21 and a plurality of second data lines 22. The insulating layer 300 may include a first insulating layer 122. The first insulating layer 122 is located on one side, away from the substrate 11, of the plurality of first data lines 21. The plurality of second data lines 22 are located on one side, away from the substrate 11, of the first insulating layer 122. The plurality of first data lines 21 and the plurality of second data lines 22 are sequentially arranged at intervals. The connector 30 may include a first connector 31 and a second connector 32. The via holes 40 include first via holes 41. The first via holes 41 are formed on the first insulating layer 122. The first connector 31 is in contact connection with the corresponding first data line 21 through the corresponding first via hole 41. The second connector 32 is in contact connection with the corresponding second data line 22.

In an exemplary embodiment, as shown in FIG. 4 and FIG. 6, the insulating layer 300 may further include a second insulating layer 123. The second insulating layer 123 is located on one side, away from the substrate 11, of the plurality of second data lines 22. The first via holes 41 penetrate the first insulating layer 122 and the second insulating layer 123. The via holes 40 may further include second via holes 42 formed on the second insulating layer 123. The second connector 32 is in contact connection with the corresponding second data line 22 through the corresponding second via hole 42.

In an exemplary embodiment, a material of the connector 30 may include metal. The connector 30 made of metal has a higher adhesion force to the surface of the data lines 20, so that the lower end of the connector 30 may be fixed better, and the fastening performance of the connector 30 to the at least one circle of barrier wall structure 50 is improved.

In an exemplary embodiment, as shown in FIG. 5 and FIG. 6, the display panel may further include a third insulating layer 121 located between the substrate 11 and the first data lines 21. The third insulating layer 121 may include a barrier layer, a buffer layer, and a gate insulating layer (not shown in the figure) which are sequentially superposed.

In an exemplary embodiment, the display panel may be of a double-gate structure. The first data line 21 and a first gate line may be arranged in the same layer, and the second data line 22 and a second gate line may be arranged in the same layer, that is, the first data line 21 and the first gate line may be formed by a one-step patterning process, and the second data line 22 and the second gate line may be formed by the one-step patterning process.

In an exemplary embodiment, the sub-pixels 101 may include thin-film transistors. The connector 30 and source electrodes or drain electrodes of the thin-film transistors may be arranged in the same layer, that is, the connector 30 and the source electrode or drain electrode of the thin-film transistor may be formed by the one-step patterning process. Thus, the source electrode, the drain electrode, and the connector 30 are formed at the same time, so that cost of the display panel cannot be affected.

In an exemplary embodiment, FIG. 2 shows a schematic structural diagram of The section A-A in FIG. 4. As shown in FIG. 4 and FIG. 2, the at least one circle of barrier wall structure 50 may include a first circle of barrier wall 51.

In an exemplary embodiment, as shown in FIG. 4, in the fan-out area 400, on the first circle of barrier wall 51, along a section in an extension direction of the first circle of barrier wall 51, the at least one circle of barrier wall structure 50 may further include a second circle of barrier wall 52, surrounding one side, away from the display area 100, of the first circle of barrier wall 51.

Figure 7:
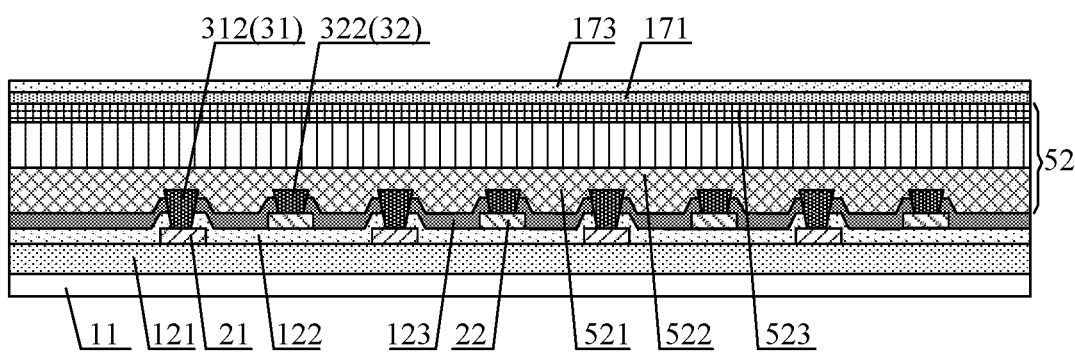
FIG. 7 is a schematic structural diagram of a section D-D in FIG. 4.

In an exemplary embodiment, FIG. 7 is a schematic structural diagram of a section D-D in FIG. 4, as shown in FIG. 6 and FIG. 7, the first connector 31 may include a first sub-connector 311 and a third sub-connector 312, and the second connector 32 may include a second sub-connector 321 and a fourth sub-connector 322. One end, away from the substrate 11, of the first sub-connector 311 extends into the first circle of barrier wall 51, and one end, facing the substrate 11, of the first sub-connector 311, is in contact connection with the first data line 21. One end, away from the substrate 11, of the third sub-connector 312 extends into the second circle of barrier wall 52, and one end, facing the substrate 11, of the third sub-connector 312, is in contact connection with the first data line 21. One end, away from the substrate 11, of the second sub-connector 321 extends into the first circle of barrier wall 51, and one end, facing the substrate 11, of the second sub-connector 321, is in contact connection with the second data line 22. One end, away from the substrate 11, of the fourth sub-connector 322 extends into the second circle of barrier wall 52, and one end, facing the substrate 11, of the fourth sub-connector 322, is in contact connection with the second data line 22. Correspondingly, the first via holes 41 may include a first sub-via hole corresponding to the first sub-connector 311 and a third sub-via hole corresponding to the third sub-connector 312, and the second via holes 42 may include a second sub-via hole corresponding to the second sub-connector 321 and a fourth sub-via hole corresponding to the fourth sub-connector 322.

In an exemplary embodiment, the display panel may be an OLED display panel.

In an exemplary embodiment, as shown in FIG. 2, FIG. 6, and FIG. 7, the insulating structural layer 12 in FIG. 2 may include the third insulating layer 121, the first insulating layer 122, and the second insulating layer 123.

In an exemplary embodiment, as shown in FIG. 2, the display panel may further include the power supply layer 13 arranged on the insulating structural layer 12, and the flat layer 14 arranged on the power supply layer 13. The flat layer 14 is located in the display area. The power supply layer 13 is located in an area out of the display area and the fan-out area 400 of the peripheral area 200. The power supply layer 13 and the source electrode and drain electrode of the thin-film transistor may be arranged in the same layer.

In an exemplary embodiment, as shown in FIG. 2, in the display area, the display panel may further include the pixel definition layer 15 arranged on the flat layer 14, the electrode layer 16 arranged on the pixel definition layer 15, the first inorganic encapsulating layer 171 arranged on the electrode layer 16, the organic encapsulating layer 172 arranged on the first inorganic encapsulating layer 171, and the second inorganic encapsulating layer 173 arranged on the organic encapsulating layer 172.

In an exemplary embodiment, as shown in FIG. 2 and FIG. 6, the first circle of barrier wall 51 may include a first sub-barrier wall 511 and a second sub-barrier wall 512. The first sub-barrier wall 511 is arranged on one side, away from the substrate 11, of the power supply layer 13, and the second sub-barrier wall 512 is stacked on one side, away from the substrate 11, of the first sub-barrier wall 511. One end, away from the substrate 11, of each of the first sub-connector 311 and the second sub-connector 321 extends into the first sub-barrier wall 511.

In an exemplary embodiment, as shown in FIG. 2 and FIG. 5, the first sub-barrier wall 511 and the pixel definition layer 15 may be arranged in the same layer, that is, the first sub-barrier wall 511 and the pixel definition layer 15 are formed by the one-step patterning process.

In an exemplary embodiment, as shown in FIG. 2 and FIG. 7, the second circle of barrier wall 52 may include a third sub-barrier wall 521, a fourth sub-barrier wall 522, and a fifth sub-barrier wall 523 which are sequentially stacked The third sub-barrier wall 521 is arranged on one side, away from the substrate 11, of the power supply layer 13, the fourth sub-barrier wall 522 is stacked on one side, away from the substrate 11, of the third sub-barrier wall 521, and the fifth sub-barrier wall 523 is stacked on one side, away from the substrate 11, of the fourth sub-barrier wall 522. One end, away from the substrate 11, of each of the third sub-connector 312 and the fourth sub-connector 322 extends into the third sub-barrier wall 521.

In an exemplary embodiment, the third sub-barrier wall 521 and the flat layer 14 may be formed by a one-step mask process, the fourth sub-barrier wall 522 and the pixel definition layer 15 may be formed by the one-step mask process, and the fifth sub-barrier wall 523 and the second sub-barrier wall 512 may be formed by the one-step patterning process.

In an exemplary embodiment, as shown in FIG. 4, FIG. 6 and FIG. 7, the display panel may further include an inorganic encapsulating layer arranged on one side, away from the substrate, of the at least one circle of barrier wall structure 50. The inorganic encapsulating layer may include the first inorganic encapsulating layer 171, and the second inorganic encapsulating layer 173 which is arranged on one side, away from the substrate 11, of the first inorganic encapsulating layer 171.

On the one hand, organics are easy to be intruded by water and oxygen. Then, when structures of the first circle of barrier wall 51 and the second circle of barrier wall 52 close to the connector are organics, intrusion of water and oxygen is easy to occur. On the other hand, when the first data lines 21 and the second data lines 22 are charged, the first sub-connector 311, the second sub-connector 321, the third sub-connector 312, and the fourth sub-connector 322 are charged. When the first sub-connector 311, the second sub-connector 321, the third sub-connector 312, and the fourth sub-connector 322 are charged, electrochemical corrosion is easy to occur. Thus, in the solution of the embodiment of the disclosure, by arranging the inorganic encapsulating layer on the side, away from the substrate 11, of the at least one circle of barrier wall structure 50, the intrusion of water and oxygen can be avoided, electrochemical corrosion can be avoided, and reliability of products will not be affected.

Cross sections of the first sub-connector 311, the second sub-connector 321, the third sub-connector 312, and the fourth sub-connector 322 shown in FIG. 4 are all square in shape. In other embodiments, the cross sections of the first sub-connector 311, the second sub-connector 321, the third sub-connector 312, and the fourth sub-connector 322 can be set randomly, for example, the cross sections of the first sub-connector 311, the second sub-connector 321, and the third sub-connector 312, and the fourth sub-connector 322 may be circular, elliptical, or polygonal, which are not limited in the embodiments of the disclosure.

Taking the display panel shown in FIG. 6 as an example, the technical solution of the embodiments of the disclosure will be described below through a preparation process of the display panel shown in FIG. 6 according to the embodiments of the disclosure.

Herein, for the "patterning process" in the embodiments of the disclosure, when a patterned material is an inorganic material or metal, the "patterning process" may include photoresist coating, mask exposure, developing, etching or photoresist peeling; when the patterned material is an organic material, the "patterning process" may include mask exposure, developing, or the like. In the embodiments of the disclosure, evaporation, deposition, coating, or the like are all mature preparation processes.

The preparation process of the display panel according to the embodiments of the disclosure may include the following operations.

Figure 8A:
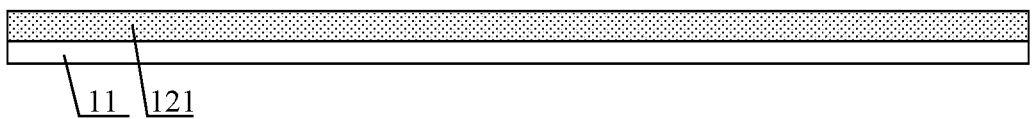
FIG. 8a is a schematic structural diagram of the section C-C after a third insulating layer is formed in a display panel according to an embodiment of the disclosure.

In S11, a third insulating layer 121 is formed on a substrate 11. As shown in FIG. 8a, FIG. 8a is a schematic structural diagram of the section C-C after a third insulating layer is formed in a display panel according to an embodiment of the disclosure.

In an exemplary embodiment, the third insulating layer 121 may be formed on the substrate 11 by using a deposition method.

In an exemplary embodiment, the third insulating layer 121 may be a single layer, or a composite layer of a barrier layer, a buffer, and a gate insulating layer.

In an exemplary embodiment, the third insulating layer may be made of a material such as silicon nitride (SiNx) or silicon oxide (SiOx). For example, the third insulating layer may be in a single-layer structure of silicon nitride or silicon oxide, or a multi-layer structure of silicon nitride/silicon oxide.

Figure 8B:
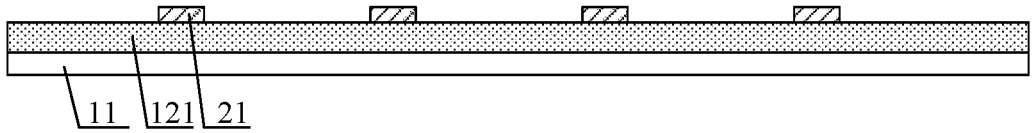
FIG. 8b is a schematic structural diagram of the section C-C after first data lines are formed in a display panel according to an embodiment of the disclosure.

In S12, a first gate electrode (not shown in the figure) and first data lines 21, located in a display area, are formed on one side, away from the substrate 11, of the third insulating layer 121. There are a plurality of first data lines 21. The plurality of first data lines 21 extend from the display area to a fan-out area, and are sequentially arranged in the fan-out area at intervals, as shown in FIG. 8b. FIG. 8b is a schematic structural diagram of the section C-C after first data lines are formed in a display panel according to an embodiment of the disclosure.

In an exemplary embodiment, S12 may include: depositing a gate metallic film on the third insulating layer 121; performing a patterning process on the gate metallic film to form a first gate electrode and first data lines 21 in the display area, herein a plurality of first data lines 21 are provided, the plurality of first data lines 21 extend from the display area to the fan-out area, and are sequentially arranged in the fan-out area at intervals.

Figure 8C:
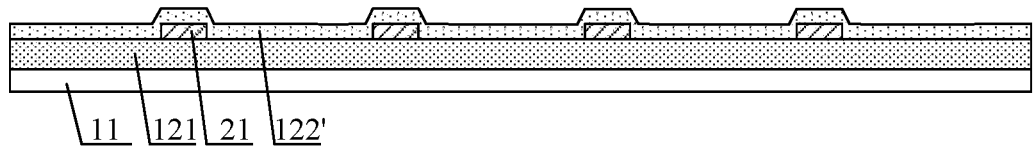
FIG. 8c is a schematic structural diagram of the section C-C after a first insulating thin-film is formed in a display panel according to an embodiment of the disclosure.

In S13, a first insulating thin-film 122' is formed on one side, away from the substrate 11, of the first data lines 21, as shown in FIG. 8c. FIG. 8c is a schematic structural diagram of the section C-C after a first insulating thin-film is formed in a display panel according to an embodiment of the disclosure.

In an exemplary embodiment, the first insulating thin-film may be made of a material such as silicon nitride (SiNx) or silicon oxide (SiOx), and may be in a single-layer structure, or a multi-layer structure of silicon nitride/silicon oxide.

Figure 8D:
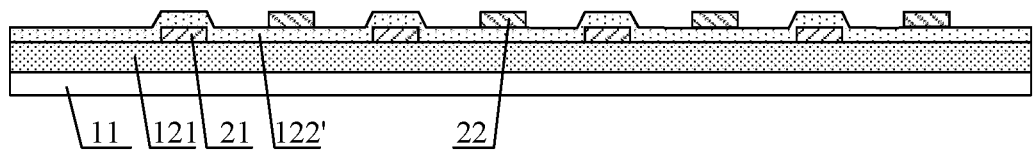
FIG. 8d is a schematic structural diagram of the section C-C after second data lines are formed in a display panel according to an embodiment of the disclosure.

In S14, a second gate electrode (not shown in the figure) and second data lines 22, located in the display area, are formed on one side, away from the substrate 11, of the first insulating thin-film 122'. The second data lines 22 are parallel to the first data lines 21. There are a plurality of second data lines 22. The plurality of second data lines 22 extend from the display area to the fan-out area. The plurality of first data lines 21 and the plurality of second data lines 22 are sequentially arranged in the fan-out area at intervals, as shown in FIG. 8d. FIG. 8d is a schematic structural diagram of the section C-C after second data lines are formed in a display panel according to an embodiment of the disclosure.

In an exemplary embodiment, S14 may include: depositing a gate metallic film on the first insulating thin-film 122'; performing a patterning process on the gate metallic film to form a second gate electrode and second data lines 22 in the display area, herein a plurality of second data lines 22 are provided, the plurality of second data lines 22 extend from the display area to the fan-out area, and the plurality of first data lines 21 and the plurality of second data lines 22 are sequentially arranged in the fan-out area at intervals.

Figure 8E:
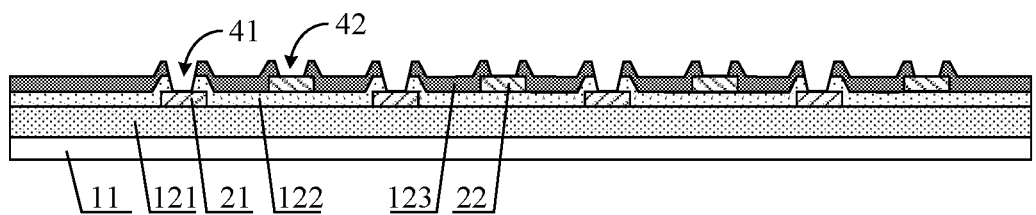
FIG. 8e is a schematic structural diagram of the section C-C after a second insulating layer is formed in a display panel according to an embodiment of the disclosure.

In S15, a second insulating layer 123 and a first insulating layer 122 are formed on one side, away from the substrate 11, of the second data lines 22. The second insulating layer 123 are provided with first via holes 41 (which may include first sub-via holes and third sub-via holes) for exposing the first data lines 21, and second via holes 42 (which may include second sub-via holes and fourth sub-via holes) for exposing the second data lines 22, as shown in FIG. 8e. FIG. 8e is a schematic structural diagram of the section C-C after a second insulating layer is formed in a display panel according to an embodiment of the disclosure.

In an exemplary embodiment, S15 may include: depositing a second insulating thin-film on one side, away from the substrate 11, of the second data lines 22; performing a patterning process on the second insulating thin-film and the first insulating thin-film to form first via holes 41 at junctions of the at least one circle of barrier wall structure and the first data lines 21 (i.e., to form first sub-via holes at junctions of the first circle of barrier wall 51 and the first data lines 21, and third sub-via holes at junctions of the second circle of barrier wall 52 and the first data lines 21) and form second via holes 42 at junctions of the at least one circle of barrier wall structure and the second data lines 22 (i.e., to form second sub-via holes at junctions of the first circle of barrier wall 51 and the second data lines 22, and fourth sub-via holes at junctions of the second circle of barrier wall 52 and the second data lines 22), so as to expose the first data lines 21 through the first via holes 41, and expose the second data lines 22 through the second via holes 42.

In an exemplary embodiment, the second insulating thin-film may be made of a material such as silicon nitride (SiNx) or silicon oxide (SiOx). For example, the second insulating thin-film may be in a single-layer structure of silicon nitride or silicon oxide, or a multi-layer structure of silicon nitride/silicon oxide.

Figure 8F:
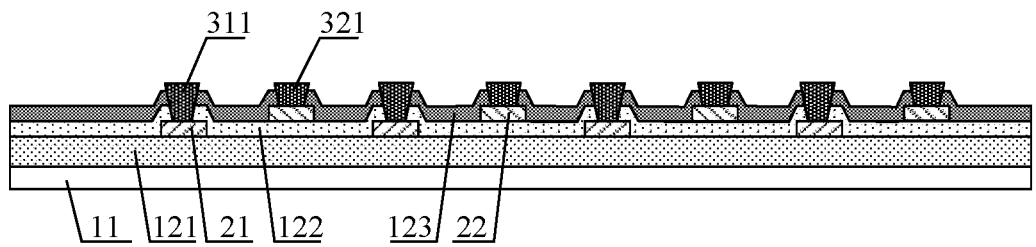
FIG. 8f is a schematic structural diagram of the section C-C after a first connector and a second connector are formed in a display panel according to an embodiment of the disclosure.

In S16, a first sub-connector 311 at the position of the first sub-via hole, a second sub-connector 321 at the position of the second sub-via hole, a third sub-connector 321 at the position of the third sub-via hole, and a fourth sub-connector 322 at the position of the fourth sub-via hole are formed on one side, away from the substrate 11, of the second insulating layer 123; one end, facing the substrate 11, of each of the first sub-connector 311 and the third sub-connector 312 is in contact connection with the first data line 21; one end, facing the substrate 11, of each of the second sub-connector 321 and the fourth sub-connector 322 is in contact connection with the second data line 22; one end, away from the substrate 11, of each of the first sub-connector 311, the second sub-connector 321, the third sub-connector 312, and the fourth sub-connector 322 protrudes from a surface, away from the substrate 11, of the second insulating layer 123, as shown in FIG. 8f. FIG. 8f is a schematic structural diagram of the section C-C after a first connector and a second connector are formed in a display panel according to an embodiment of the disclosure.

In an exemplary embodiment, S16 may include: forming a metal thin-film on one side, away from the substrate 11, of the second insulating layer 123; performing a patterning process on the metal thin-film to form a source electrode and a drain electrode in the display area, to form the power supply layer (as shown in FIG. 2) in an area out of the fan-out area of the peripheral area, and a first sub-via connector 311 at the position of the first sub-via hole, a second sub-connector 321 at the position of the second sub-via hole, a third sub-connector 312 at the position of the third sub-via hole, and a fourth sub-connector 322 at the position of the fourth sub-via hole in the fan-out area. One end, facing the substrate 11, of each of the first sub-connector 311 and the third sub-connector 312 is in contact connection with the first data line 21; one end, facing the substrate 11, of each of the second sub-connector 321 and the fourth sub-connector 322 is in contact connection with the second data line 22; and one end, away from the substrate 11, of each of the first sub-connector 311, the second sub-connector 321, the third sub-connector 312, and the fourth sub-connector 322 protrudes from a surface, away from the substrate 11, of the second insulating layer 123.

Figure 8G:
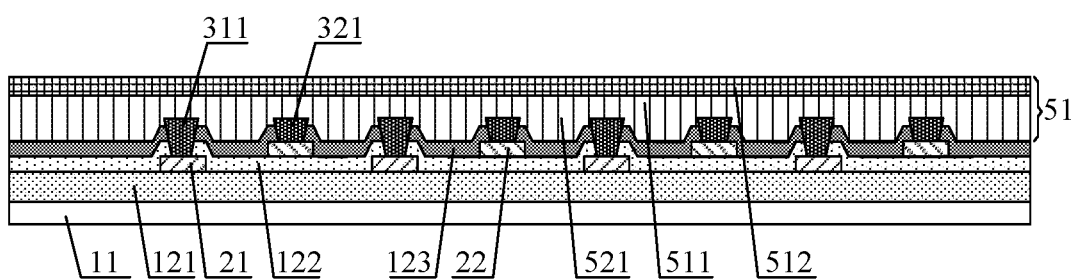
FIG. 8g is a schematic structural diagram of the section C-C after a first circle of barrier wall is formed in a display panel according to an embodiment of the disclosure.

In S17, a first sub-barrier wall 511 and a second sub-barrier wall 512 are sequentially formed on one side, away from the substrate 11, of the first sub-connector 311, the second sub-connector 321, the third sub-connector 312, and the fourth sub-connector 322, as shown in FIG. 8g. FIG. 8g is a schematic structural diagram of the section C-C after a first circle of barrier wall is formed in a display panel according to an embodiment of the disclosure.

In an exemplary embodiment, S17 may include: coating one side, away from the substrate 11, of the first sub-connector 311, the second sub-connector 321, the third sub-connector 312, and the fourth sub-connector 322 with a first organic thin-film; performing a patterning process on the first organic thin-film to form a flat layer 14 in the display area and at the position close to the edge of the display panel, and form a third sub-barrier wall 521 in the peripheral area. As shown in FIG. 2 and FIG. 6, the third sub-barrier wall 521 covers the third sub-connector 312 and the fourth sub-connector 322, so that one end, away from the substrate 11, of each of the third sub-connector 312 and the fourth sub-connector 322 extends into the third sub-barrier wall 521. One side, away from the substrate 11, of the third sub-barrier wall 521 is coated with a second organic thin-film. The second organic thin-film is subjected to a patterning process to form the pixel definition layer 15 (as shown in FIG. 2) in the display area, and form a first sub-barrier wall 511 and a fourth sub-barrier wall 522 stacked on one side, away from the substrate 11, of the third sub-barrier wall 521 in the peripheral area. As shown in FIG. 2, FIG. 7, and FIG. 8g, the first sub-barrier wall 511 is located on one side, facing the display area, of the third sub-barrier wall 521, the first sub-barrier wall 511 covers the first sub-connector 311 and the second sub-connector 321, so that one end, away from the substrate 11, of each of the first sub-connector 311 and the second sub-connector 321 extends into the first sub-barrier wall 511, as shown in FIG. 8g. Further, a second sub-barrier wall 512 stacked on one side, away from the substrate 11, of the first sub-barrier wall 511 and a fifth sub-barrier wall 523 stacked on one side, away from the substrate, of the fourth sub-barrier wall 522 are formed, as shown in FIG. 2, FIG. 7, and FIG. 8g.

In S18, an electrode layer 16 is formed on one side, away from the substrate 11, of the pixel definition layer 15, as shown in FIG. 2.

A preparation process for forming the electrode layer 16 will not be elaborated here.

In S19, a first inorganic encapsulating layer 171 is formed on the substrate on which the foregoing patterns are formed, and is located in the display area and the peripheral area; an organic encapsulating layer 172 is formed on one side, away from the substrate 11, of the first inorganic encapsulating layer 171, and is located in the display area; a second inorganic encapsulating layer 173 is formed on one side, away from the substrate 11, of the organic encapsulating layer 172, and is located in the display area and the peripheral area, as shown in FIG. 2 and FIG. 7.

Preparation processes for forming the first inorganic encapsulating layer 171, the organic encapsulating layer 172, and the second inorganic encapsulating layer 173 will not be elaborated here.

Those skilled in the art understand that the preparation process of the display panel may further include steps of forming a source electrode, forming an anode layer of an OLED, forming an organic light emitting layer of the OLED, and the like, which will not be elaborated here.

The embodiments of the disclosure further provide a display device, which may include the display panel according to the foregoing embodiments. The display device may be any product or component having a display function, such as a cellphone, a tablet personnel computer, a television, a display, a laptop, a digital photo frame, and a navigator.

In the descriptions of the embodiments of the disclosure, orientation or position relationships indicated by terms "center", "up", "down", "front", "back", "vertical", "horizontal", "top", "bottom", "inner", "outer", and the like are orientation or position relationships shown in the drawings, are adopted not to indicate or imply that indicated devices or elements must be in specific orientations or structured and operated in specific orientations but only to conveniently describe the disclosure and simplify descriptions and thus should not be understood as limits to the disclosure.

In the descriptions of the embodiments of the disclosure, unless otherwise specified and limited, terms "mounting", "mutual connection" and "connection" should be generally understood. For example, the connection may be fixed connection or detachable connection or integral connection, the connection may be mechanical connection or electrical connection, and the connection may be direct connection or indirect connection through an intermediate or communication inside two elements. Those of ordinary skill in the art can understand implications of the above terms in the disclosure according to situations.

Although the implementation manners in the disclosure are as described above, the content described is only the implementation manners facilitating understanding of the disclosure, and is not intended to limit the disclosure. Any of those skilled in the art of the disclosure can make any modifications and variations in the implementation manner and details without departing from the spirit and scope of the disclosure. However, the patent protection scope of the disclosure should be subject to the scope defined by the appended claims.

What is claimed is:

1. A display panel, comprising:
a substrate comprising a display area and a peripheral area which surrounds the display area and comprises a fan-out area;
a plurality of sub-pixels located in the display area;
a plurality of data lines located on one side of the substrate and in the display area, extending from the display area to the fan-out area, and arranged to provide data signals to the plurality of sub-pixels;
at least one circle of barrier wall structure surrounding the display area, wherein at least a part of the at least one circle of barrier wall structure is located in the fan-out area, and the at least one circle of barrier wall structure is located on one side, away from the substrate, of the plurality of data lines; and
a connector located between the plurality of data lines and the at least one circle of barrier wall structure, wherein one end, away from the substrate, of the connector extends into the at least one circle of barrier wall structure to fasten the at least one circle of barrier wall structure.

2. The display panel according to claim 1, further comprising: an insulating layer located between the plurality of data lines and the at least one circle of barrier wall structure, wherein the connector is arranged between the insulating layer and the at least one circle of barrier wall structure, and one end of the connector, facing the substrate, is embedded into the insulating layer.

3. The display panel according to claim 2, wherein the insulating layer is provided with via holes, and the connector is in contact connection with the data lines through the via holes.

4. The display panel according to claim 3, wherein the plurality of data lines comprise a plurality of first data lines and a plurality of second data lines, the insulating layer comprises a first insulating layer, the first insulating layer is located on one side, away from the substrate, of the plurality of first data lines, and the plurality of second data lines are located on one side, away from the substrate, of the first insulating layer;
the connector comprises a first connector and a second connector, the via holes comprise a first via hole formed on the first insulating layer, the first connector is in contact connection with a first data line through the first via hole, and the second connector is in contact connection with a second data line.

5. The display panel according to claim 4, wherein the insulating layer further comprises a second insulating layer, wherein the second insulating layer is located on one side, away from the substrate, of the plurality of second data lines, the first via hole penetrates the first insulating layer and the second insulating layer, the via holes further comprise a second via holes formed on the second insulating layer, and the second connector is in contact connection with a second data line through the second via hole.

6. The display panel according to claim 1, wherein a material of the connector comprises metal, the display panel further comprises an inorganic encapsulating layer arranged on one side, away from the substrate, of the at least one circle of barrier wall structure.

7. The display panel according to claim 1, wherein the sub-pixels comprise thin-film transistors, and the connector and source electrodes or drain electrodes of the thin-film transistors are arranged in the same layer.

8. The display panel according to claim 1, wherein the at least one circle of barrier wall structure comprises a first circle of barrier wall, the first circle of barrier wall comprises a first sub-barrier wall and a second sub-barrier wall which are sequentially stacked, the first sub-barrier wall faces the substrate, and one end, away from the substrate, of the connector extends into the first sub-barrier wall.

9. The display panel according to claim 8, wherein the at least one circle of barrier wall structure further comprises a second circle of barrier wall, the second circle of barrier wall is located on one side, away from the display area, of the first circle of barrier wall, and comprises a third sub-barrier wall, a fourth sub-barrier wall, and a fifth sub-barrier wall which are sequentially stacked, the third sub-barrier wall faces the substrate, and one end, away from the substrate, of the connector extends into the third sub-barrier wall.

10. The display panel according to claim 9, further comprising a flat layer located in the display area, wherein the flat layer is located on one side, away from the substrate, of the connector, and the third sub-barrier wall and the flat layer are arranged in the same layer.

11. The display panel according to claim 10, further comprising a pixel definition layer located in the display area, wherein the pixel definition layer is located on one side, away from the substrate, of the flat layer, and both the first sub-barrier wall and the fourth sub-barrier wall are arranged in the same layer as the pixel definition layer.

12. The display panel according to claim 9, wherein the second sub-barrier wall and the fifth sub-barrier wall are arranged in the same layer.

13. A display device, comprising the display panel according to claim 1.

14. The display panel according to claim 2, wherein the at least one circle of barrier wall structure comprises a first circle of barrier wall, the first circle of barrier wall comprises a first sub-barrier wall and a second sub-barrier wall which are sequentially stacked, the first sub-barrier wall faces the substrate, and one end, away from the substrate, of the connector extends into the first sub-barrier wall.

15. The display panel according to claim 14, wherein the at least one circle of barrier wall structure further comprises a second circle of barrier wall, the second circle of barrier wall is located on one side, away from the display area, of the first circle of barrier wall, and comprises a third sub-barrier wall, a fourth sub-barrier wall, and a fifth sub-barrier wall which are sequentially stacked, the third sub-barrier wall faces the substrate, and one end, away from the substrate, of the connector extends into the third sub-barrier wall.

16. The display panel according to claim 15, further comprising a flat layer located in the display area, wherein the flat layer is located on one side, away from the substrate, of the connector, and the third sub-barrier wall and the flat layer are arranged in the same layer.

17. The display panel according to claim 16, further comprising a pixel definition layer located in the display area, wherein the pixel definition layer is located on one side, away from the substrate, of the flat layer, and both the first sub-barrier wall and the fourth sub-barrier wall are arranged in the same layer as the pixel definition layer.

18. The display panel according to claim 15, wherein the second sub-barrier wall and the fifth sub-barrier wall are arranged in the same layer.

19. The display panel according to claim 3, wherein the at least one circle of barrier wall structure comprises a first circle of barrier wall, the first circle of barrier wall comprises a first sub-barrier wall and a second sub-barrier wall which are sequentially stacked, the first sub-barrier wall faces the substrate, and one end, away from the substrate, of the connector extends into the first sub-barrier wall.

20. The display panel according to claim 19, wherein the at least one circle of barrier wall structure further comprises a second circle of barrier wall, the second circle of barrier wall is located on one side, away from the display area, of the first circle of barrier wall, and comprises a third sub-barrier wall, a fourth sub-barrier wall, and a fifth sub-barrier wall which are sequentially stacked, the third sub-barrier wall faces the substrate, and one end, away from the substrate, of the connector extends into the third sub-barrier wall.

* * * * *